United States Patent
Wong et al.

(10) Patent No.: US 11,295,995 B2
(45) Date of Patent: Apr. 5, 2022

(54) TESTING SRAM STRUCTURES

(71) Applicant: International Business Machines Corporation, Armonk, NY (US)

(72) Inventors: Robert Wong, Poughkeepsie, NY (US); Alfred Bruno, Staatsburg, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 338 days.

(21) Appl. No.: 16/572,769

(22) Filed: Sep. 17, 2019

(65) Prior Publication Data

US 2021/0082776 A1    Mar. 18, 2021

(51) Int. Cl.
G11C 7/00      (2006.01)
H01L 21/66     (2006.01)
H01L 27/11     (2006.01)

(52) U.S. Cl.
CPC .............. *H01L 22/14* (2013.01); *H01L 22/22* (2013.01); *H01L 27/1104* (2013.01)

(58) Field of Classification Search
CPC ....... H01L 22/14; H01L 27/22; H01L 27/1104
USPC ......................................................... 365/201
See application file for complete search history.

(56) References Cited

U.S. PATENT DOCUMENTS

| | | | |
|---|---|---|---|
| 5,745,415 A | 4/1998 | Marr | |
| 7,079,433 B1* | 7/2006 | Chen | G11C 29/006 365/190 |
| 7,385,864 B2* | 6/2008 | Loh | G11C 7/02 365/154 |
| 7,463,508 B2* | 12/2008 | Pineda De Gyvez | G11C 29/50 365/154 |
| 7,724,023 B1* | 5/2010 | Fratti | G01R 31/31905 326/16 |
| 7,772,866 B2* | 8/2010 | Patterson | H01L 22/34 324/750.3 |
| 7,881,135 B2* | 2/2011 | Cannon | G01R 31/318594 365/201 |
| 8,261,138 B2* | 9/2012 | Chang | G11C 29/50012 714/718 |

(Continued)

OTHER PUBLICATIONS

Fried, D.M., et al., "Aggressively Scaled 0.143 um2) 6T-SRAM Cell for the 32 nm Node and Beyond," IBM SEmiconductor Research and Development Center (SRDC), 4 pages.

(Continued)

*Primary Examiner* — Viet Q Nguyen
(74) *Attorney, Agent, or Firm* — Cantor Colburn LLP; Randall Bluestone

(57) ABSTRACT

A technique relates probing a pass gate transistor in a static random access memory (SRAM) circuit. A gate probe is connected to a gate metal layer of the SRAM circuit, the gate metal layer being coupled to a gate of the pass gate transistor. A source probe is connected to a source metal layer of the SRAM circuit, the source metal layer being coupled to a source of the pass gate transistor. A drain probe is connected to a drain metal layer of the SRAM circuit, the drain metal layer being coupled to a drain of the pass gate transistor, the SRAM circuit comprising other transistors along with the pass gate transistor. The other transistors are free from connections for the probing so as not to cause the other transistors to have an unwanted effect on the pass gate transistor being probed.

20 Claims, 18 Drawing Sheets

(56) References Cited

U.S. PATENT DOCUMENTS

| | | | |
|---|---|---|---|
| 8,294,485 B2* | 10/2012 | Ouyang | H01L 27/1104 324/762.01 |
| 8,399,266 B2* | 3/2013 | Mo | H01L 29/49 438/18 |
| 8,409,882 B2* | 4/2013 | Acar | H01L 22/34 438/17 |
| 8,787,074 B2 | 7/2014 | Patterson et al. | |
| 8,971,099 B1* | 3/2015 | Wang | G11C 29/50004 365/154 |
| 9,601,392 B1 | 3/2017 | Lei et al. | |
| 10,121,713 B1* | 11/2018 | Paul | H01L 22/34 |
| 2011/0273946 A1* | 11/2011 | Deng | G11C 29/54 365/201 |
| 2015/0294738 A1 | 10/2015 | Ahsan et al. | |
| 2016/0099184 A1 | 4/2016 | Lee et al. | |

OTHER PUBLICATIONS

Wong, R.C., "An ac test structure for fast memory arrays," Mar./May 1990, vol. 34, No. 2/3, IBM J. Res. Develop., 11 pages.

* cited by examiner

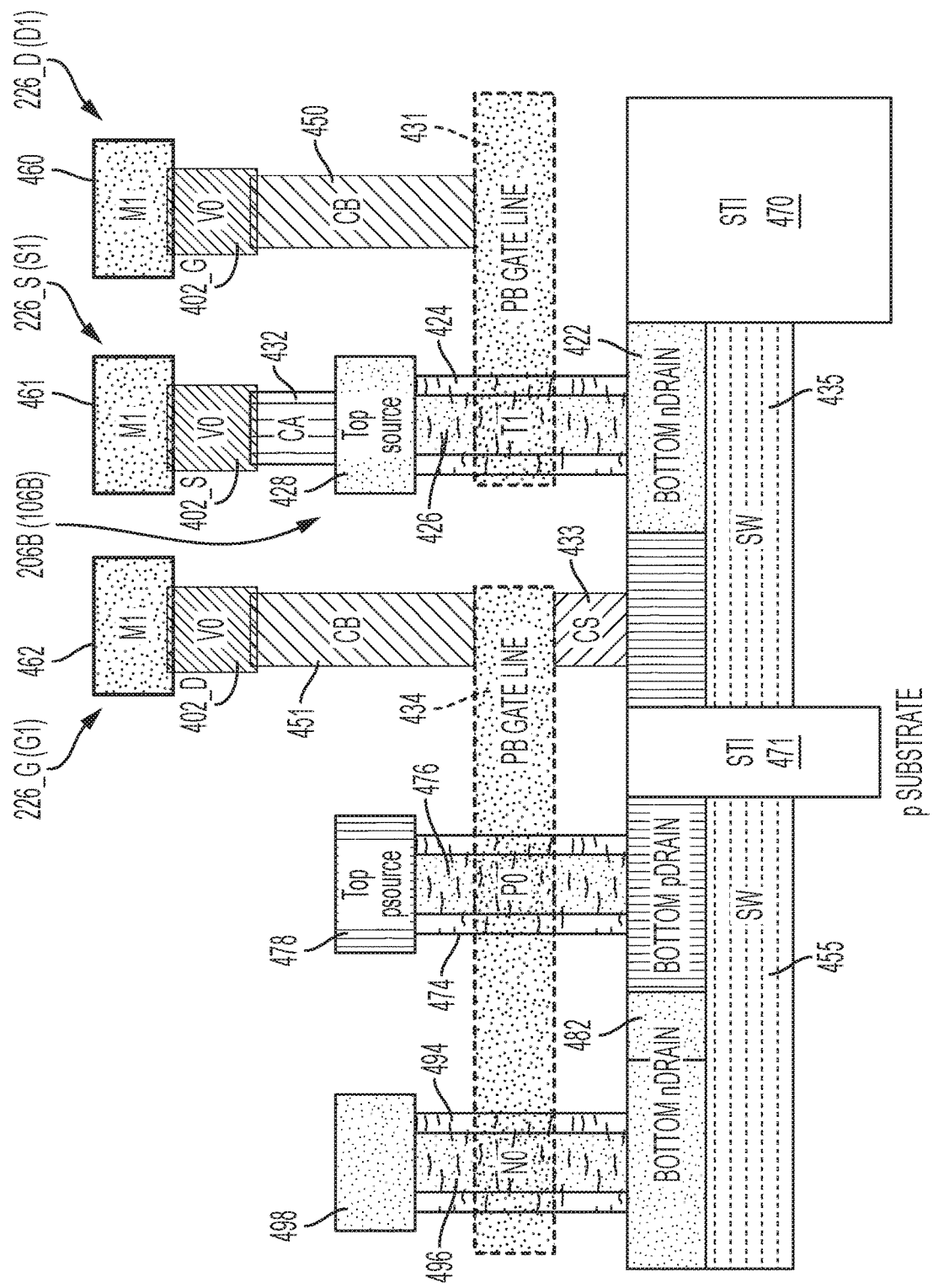

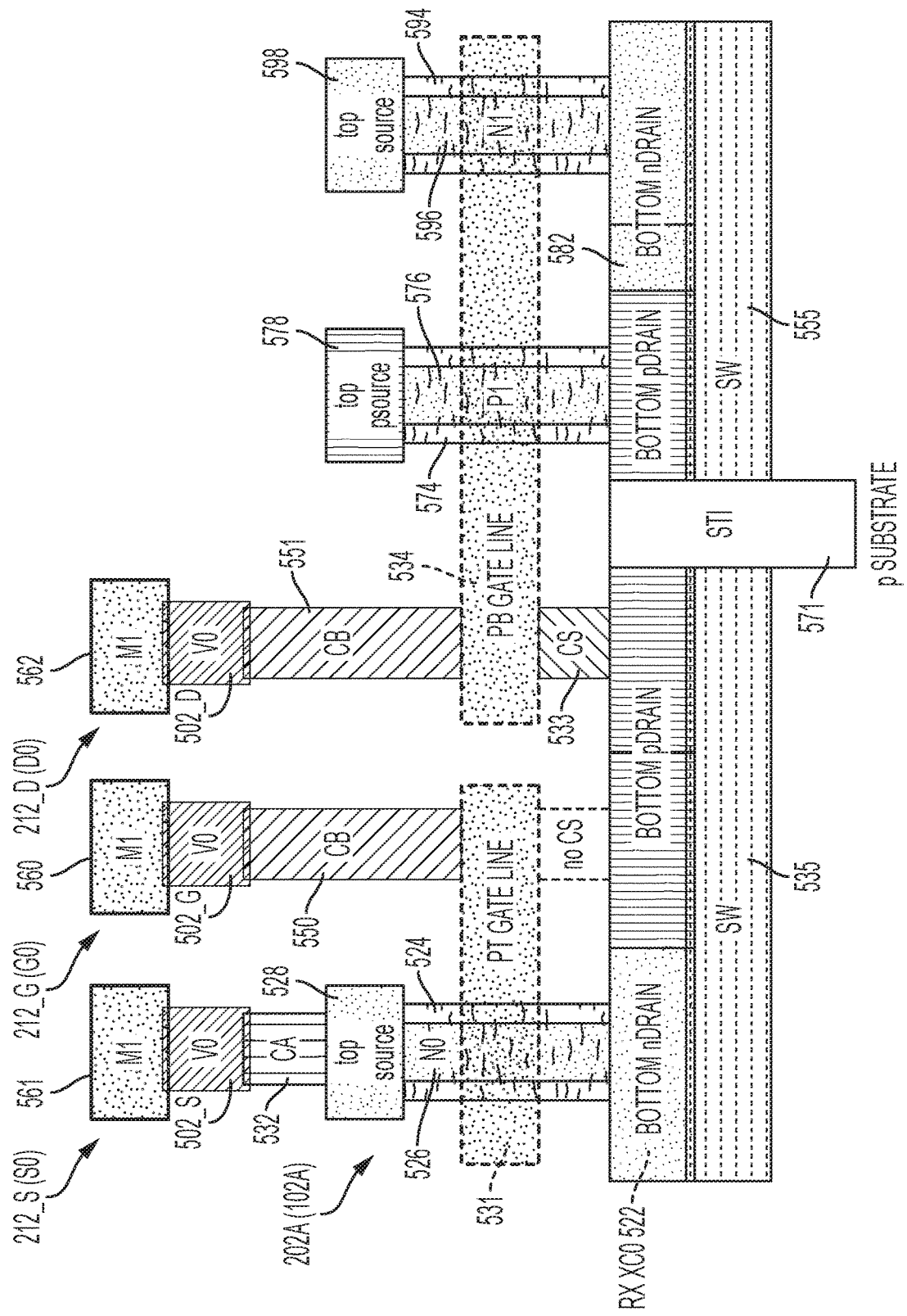

FIG. 9 — 900

CONNECT A GATE PROBE TO A GATE METAL LAYER OF THE SRAM CIRCUIT, THE GATE METAL LAYER BEING COUPLED TO A GATE OF THE PASSGATE TRANSISTOR 902

↓

CONNECT A SOURCE PROBE TO A SOURCE METAL LAYER OF THE SRAM CIRCUIT, THE SOURCE METAL LAYER BEING COUPLED TO A SOURCE OF THE PASSGATE TRANSISTOR 904

↓

CONNECT A DRAIN PROBE TO A DRAIN METAL LAYER OF THE SRAM CIRCUIT, THE DRAIN METAL LAYER BEING COUPLED TO A DRAIN OF THE PASSGATE TRANSISTOR, THE SRAM CIRCUIT COMPRISING OTHER TRANSISTORS ALONG WITH THE PASSGATE TRANSISTOR 906

↓

AVOID A PROBING OF THE OTHER TRANSISTORS IN THE SRAM CIRCUIT, THE OTHER TRANSISTORS BEING FREE FROM CONNECTIONS FOR THE PROBING SO AS NOT TO CAUSE THE OTHER TRANSISTORS TO HAVE AN UNWANTED EFFECT ON THE PASSGATE TRANSISTOR BEING PROBED 908

FIG. 10

CONNECT A GATE PROBE TO A GATE METAL LAYER OF THE SRAM CIRCUIT, THE GATE METAL LAYER BEING COUPLED TO A GATE OF THE PULLDOWN TRANSISTOR  1002

CONNECT A SOURCE PROBE TO A SOURCE METAL LAYER OF THE SRAM CIRCUIT, THE SOURCE METAL LAYER BEING COUPLED TO A SOURCE OF THE PULLDOWN TRANSISTOR  1004

CONNECT A DRAIN PROBE TO A DRAIN METAL LAYER OF THE SRAM CIRCUIT, THE DRAIN METAL LAYER BEING COUPLED TO A DRAIN OF THE PULLDOWN TRANSISTOR, THE SRAM CIRCUIT COMPRISING OTHER TRANSISTORS ALONG WITH THE PULLDOWN TRANSISTOR  1006

AVOID A PROBING OF THE OTHER TRANSISTORS IN THE SRAM CIRCUIT, THE OTHER TRANSISTORS BEING FREE FROM CONNECTIONS FOR THE PROBING SO AS NOT TO CAUSE THE OTHER TRANSISTORS TO HAVE AN UNWANTED EFFECT ON THE PULLDOWN TRANSISTOR BEING PROBED  1008

CONNECT A GATE PROBE TO A GATE METAL LAYER OF THE SRAM CIRCUIT, THE GATE METAL LAYER BEING COUPLED TO A GATE OF THE PULLUP TRANSISTOR  1102

↓

CONNECT A SOURCE PROBE TO A SOURCE METAL LAYER OF THE SRAM CIRCUIT, THE SOURCE METAL LAYER BEING COUPLED TO A SOURCE OF THE PULLUP TRANSISTOR  1104

↓

CONNECT A DRAIN PROBE TO A DRAIN METAL LAYER OF THE SRAM CIRCUIT, THE DRAIN METAL LAYER BEING COUPLED TO A DRAIN OF THE PULLUP TRANSISTOR, THE SRAM CIRCUIT COMPRISING OTHER TRANSISTORS ALONG WITH THE PULLUP TRANSISTOR  1106

↓

AVOID A PROBING OF THE OTHER TRANSISTORS IN THE SRAM CIRCUIT, THE OTHER TRANSISTORS BEING FREE FROM CONNECTIONS FOR THE PROBING SO AS NOT TO CAUSE THE OTHER TRANSISTORS TO HAVE AN UNWANTED EFFECT ON THE PULLUP TRANSISTOR BEING PROBED  1108

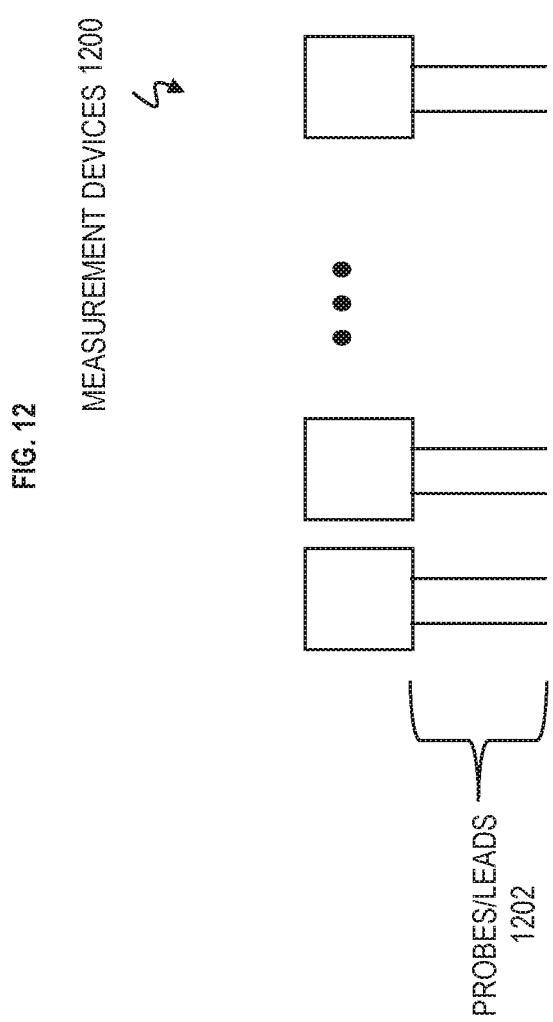

TESTING SRAM STRUCTURES

BACKGROUND

The present invention generally relates to fabrication methods and resulting structures for semiconductor devices, and more specifically, to fabrication methods and resulting structures for testing static random access memory (SRAM) structures.

SRAM is a type of semiconductor memory that uses bi-stable latching circuitry (flip-flop) to store each bit. SRAM exhibits data remanence but it is still volatile in the conventional sense that data are eventually lost when the memory is not powered. The term "static" differentiates SRAM from DRAM (dynamic random access memory) which must be periodically refreshed. The term "random access" means that in an array of SRAM cells each cell can be read or written in any order, no matter which cell was last accessed. SRAM is faster and more expensive than DRAM. An SRAM cell can be a structure with 6 transistors for storing one bit of information, and the core of the cell is formed by two complementary metal-oxide-semiconductor (CMOS) inverters, where the output potential of each inverter is fed as input into the other. This feedback loop stabilizes the inverters to their respective state.

SUMMARY

Embodiments of the invention are directed to a method for probing a pass gate transistor in a static random access memory (SRAM) circuit. A non-limiting example of the method includes connecting a gate probe to a gate metal layer of the SRAM circuit, the gate metal layer being coupled to a gate of the pass gate transistor, and connecting a source probe to a source metal layer of the SRAM circuit, the source metal layer being coupled to a source of the pass gate transistor. The method includes connecting a drain probe to a drain metal layer of the SRAM circuit, the drain metal layer being coupled to a drain of the pass gate transistor, the SRAM circuit comprising other transistors along with the pass gate transistor. The other transistors are free from connections for the probing so as not to cause the other transistors to have an unwanted effect on the pass gate transistor being probed.

Embodiments of the invention are directed to a method for probing a pulldown transistor in a static random access memory (SRAM) circuit. A non-limiting example of the method includes connecting a gate probe to a gate metal layer of the SRAM circuit, the gate metal layer being coupled to a gate of the pulldown transistor, and connecting a source probe to a source metal layer of the SRAM circuit, the source metal layer being coupled to a source of the pulldown transistor. The method includes connecting a drain probe to a drain metal layer of the SRAM circuit, the drain metal layer being coupled to a drain of the pulldown transistor, the SRAM circuit comprising other transistors along with the pulldown transistor. The other transistors are free from connections for the probing so as not to cause the other transistors to have an unwanted effect on the pulldown transistor being probed.

Embodiments of the invention are directed to a method for probing a pullup transistor in a static random access memory (SRAM) circuit. A non-limiting example of the method includes connecting a gate probe to a gate metal layer of the SRAM circuit, the gate metal layer being coupled to a gate of the pullup transistor, and connecting a source probe to a source metal layer of the SRAM circuit, the source metal layer being coupled to a source of the pullup transistor. The method includes connecting a drain probe to a drain metal layer of the SRAM circuit, the drain metal layer being coupled to a drain of the pullup transistor, the SRAM circuit comprising other transistors along with the pullup transistor. The other transistors are free from connections for the probing so as not to cause the other transistors to have an unwanted effect on the pullup transistor being probed.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4 depicts a block diagram of an example stacked view of a pass gate transistor (T1) according to one or more embodiments of the invention;

FIG. 5C depicts a block diagram of an example stacked view of a pulldown transistor (N0) according to one or more embodiments of the invention;

FIG. 9 depicts a flowchart of a method of probing a pass gate transistor (T0, T1) according to one or more embodiments of the invention;

FIG. 10 depicts a flowchart of a method of probing a pulldown transistor (N0, N1) according to one or more embodiments of the invention;

FIG. 11 depicts a flowchart of a method of probing a pullup transistor (P0, P1) according to one or more embodiments of the invention; and FIG. 12 depicts greatly simplified representations of testing/measurement devices which can be utilized to test and measure the transistors discussed herein according to one or more embodiments.

Figure 1:
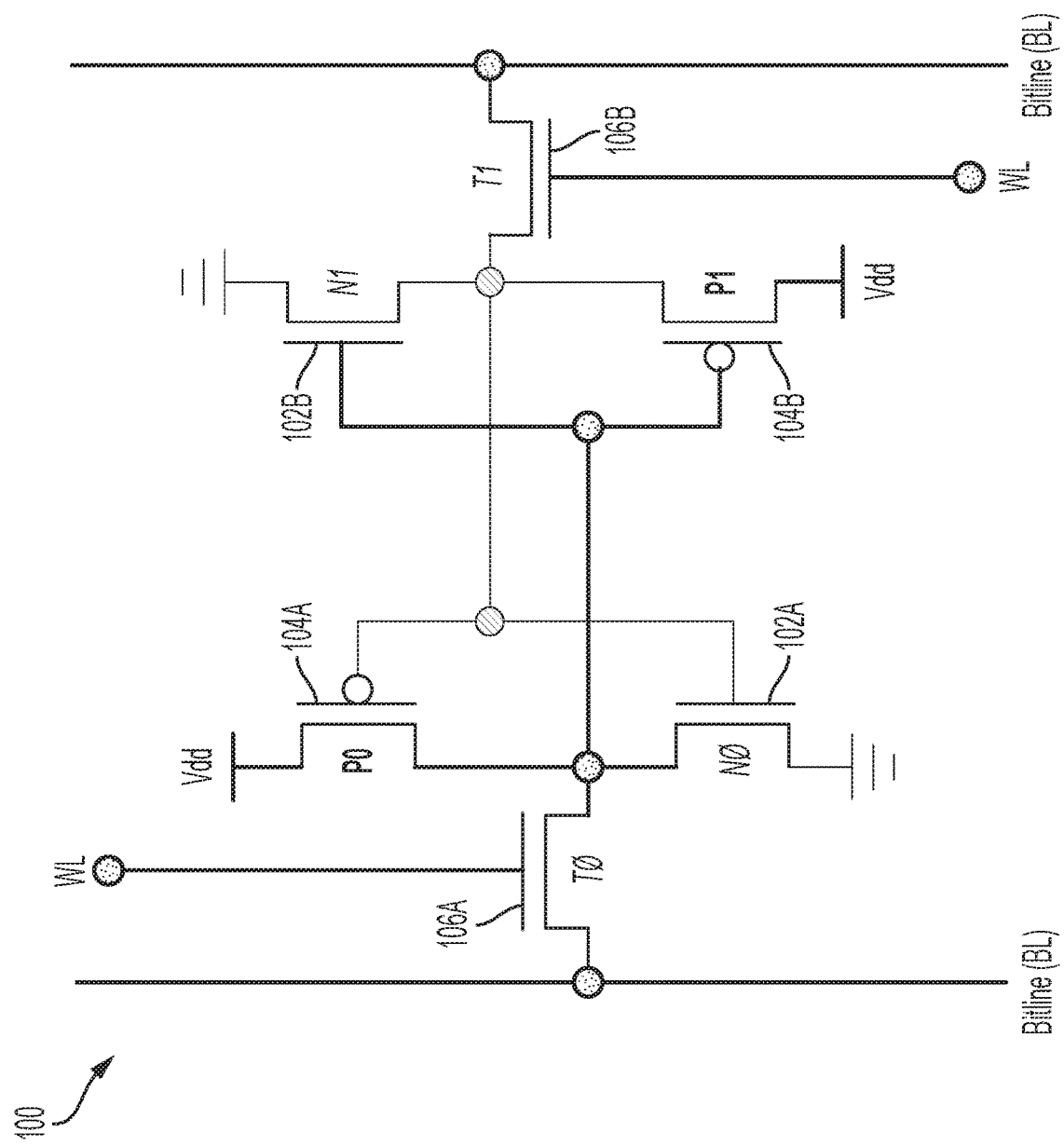
FIG. 1 depicts a schematic of an example SRAM device according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

As one of the 6 transistors used in a single SRAM cell, a metal-oxide-semiconductor field-effect transistor (MOSFET) is used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of nonplanar MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Transistors are utilized in SRAM circuits.

One type of MOSFET is a non-planar FET known generally as a vertical FET (VFET), which can be used in a SRAM cell. VFETs employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

Turning now to an overview of technologies that are more specifically relevant to aspects of the invention, devices of bit cells in an SRAM are no longer measurable in scaled down nodes. Bit cell layout has to be redesigned to allow direct access to internal nodes, and single FET terminals need to be disconnected from common contacts of adjacent cell devices. Bit cell environments are also modified to allow probe line connection to probe pads, and device characteristics are thus grossly distorted by LLE (local layout effects).

Turning now to an overview of aspects of the invention, one or more embodiments of the invention provide techniques configured and arranged to use a single 6 FET device under test (DUT) to make non-destructive access to FET terminals in real or authentic SRAM product environments, which is in contrast to state-of-the-art techniques that use single cell DUT measurements in artificial SRAM environments. The techniques discussed herein are configured to eliminate layout disruption of process of record (POR) bit cell layout, maintain dummy cross connect (XC) between inverters to minimize LLE, avoid lower level metal (M1) congestion to access FET terminals, and utilize existing SRAM product wiring to probe FET terminals. The same test structure can also be embedded in real SRAM arrays around relevant locations for early debug and process monitoring at the lower level metal (M1), for example, before forming the higher level metal (M2).

Turning now to a more detailed description of aspects of the present invention, FIG. 1 depicts a schematic of a SRAM device/circuit 100 according to one or more embodiments of the invention. The single SRAM circuit 100 includes 6 FETs. The SRAM circuit 100 includes two inverters coupled together. One inverter includes an n-type FET 102A (e.g., N0) coupled to a p-type FET 104A (e.g., P0), while the other inverter includes an n-type FET 102B (e.g., N1) coupled to a p-type FET 104B (e.g., P1). The p-type FETs 104A and 104B (P0 and P1) are pullup (PU) transistors having their sources coupled to voltage supplies (VDD). The n-type FETs 102A and 102B (N0 and N1) are pulldown (PD) transistors having their sources coupled to ground. The drains and gates of the FET 102A and FET 104A are coupled together to form the inverter. Similarly, the drains and gates of the FET 102B and FET 104B are coupled together to form the inverter. An n-type FET 106A (e.g., pass gate T0) is coupled to the drains of FET 104A (P0) and FET 102A (N0), along with coupling to the gates of FET 104B (P1) and FET 102B (N1). Similarly, an n-type FET 106B (e.g., pass gate T1) is coupled to the drains of FET 104B (P1) and FET 102B (N1), along with coupling to the gates of FET 104A (P0) and FET 102A (N0). The sources of pass gate FET 106A (T0) and FET 106B (T1) are respectively coupled to bit lines (which can be the complement of one another).

The SRAM 100 is a single bit cell, and numerous SRAMs are connected together in a semiconductor device. By having numerous SRAMs in a semiconductor device, it can be difficult to test an individual transistor in its normal operating environment. However, one or more embodiments provide methods to measure or test individual transistors, such as FETs 102A, 102B, 104A, 104B, 106A, and 106B in a single SRAM circuit 100. In one or more embodiments of the invention, each FET is tested in its own SRAM circuit 100 separately from testing other transistors, which means 6 SRAM circuits would be utilized to test/probe 6 FETs. Although a state-of-the-art probing technique might be to probe all 6 transistors from a single SRAM circuit, the layout of the SRAM circuit under test would be completely changed to accommodate the probe connection to all 6 transistors in the area of the single SRAM circuit (i.e., single bit cell). However, if only 1 transistor per SRAM circuit is probed according to embodiments of the invention, then the cell layout change is minimal or zero in the case of VFET technology, because existing SRAM wiring is utilized to serve as built-in probes to the single transistor.

Figure 2:
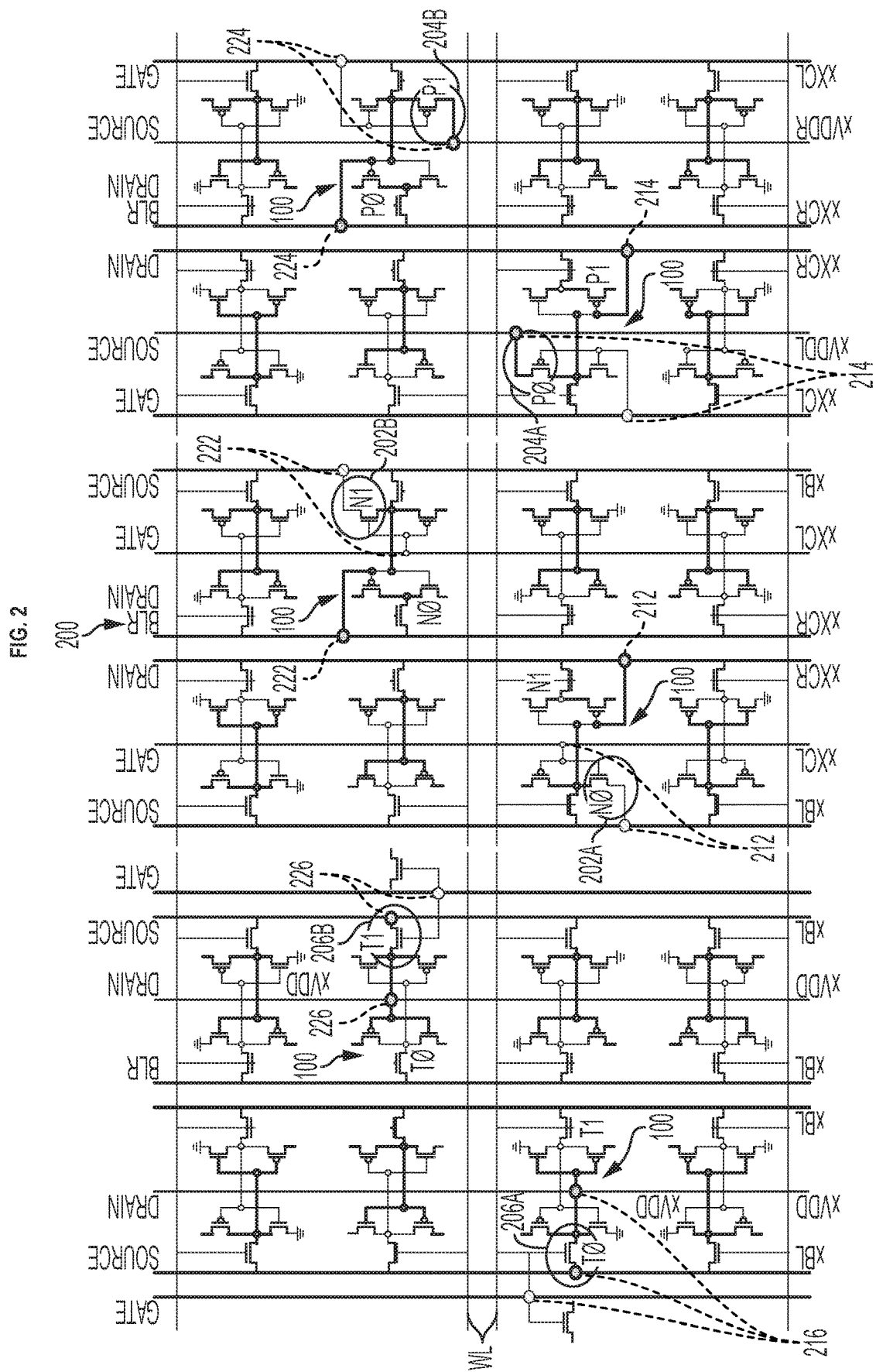
FIG. 2 depicts a schematic of an example semiconductor device according to one or more embodiments of the invention.

FIG. 2 depicts an example schematic of a semiconductor device 200 according to one or more embodiments. The semiconductor device 200 is a structure overview of numerous SRAM circuits 100. Although only select SRAMs 100 are labeled in FIG. 2 for illustration purposes, it should be appreciated that 24 SRAMs are present. Word lines run in the horizontal direction and bit lines extend in the vertical direction. In the semiconductor device 200, various individual transistors are highlighted as circles 202A, 202B for any general N0 and N1 transistors, circles 204A, 204B for any general P0 and P1 transistors, and circles 206A, 206B for any general pass gate T0 and T1 transistors. In normal SRAM circuits, the sources of n-type transistors N0 and N1 are coupled to a low voltage supply such as VSS or ground, while the sources of p-type transistor P0 and P1 are coupled to a high voltage supply such as voltage supply (this connection is not be shown in FIG. 2 so as not to unnecessarily obstruct the figure). Probe points are generally depicted as 212, 214, 216, 222, 224, 226 in FIG. 2 but will be more particularly delineated with appendages "_G" for gate, "_S" for source, and "_D" for drain, as discussed further below.

Figure 3A:
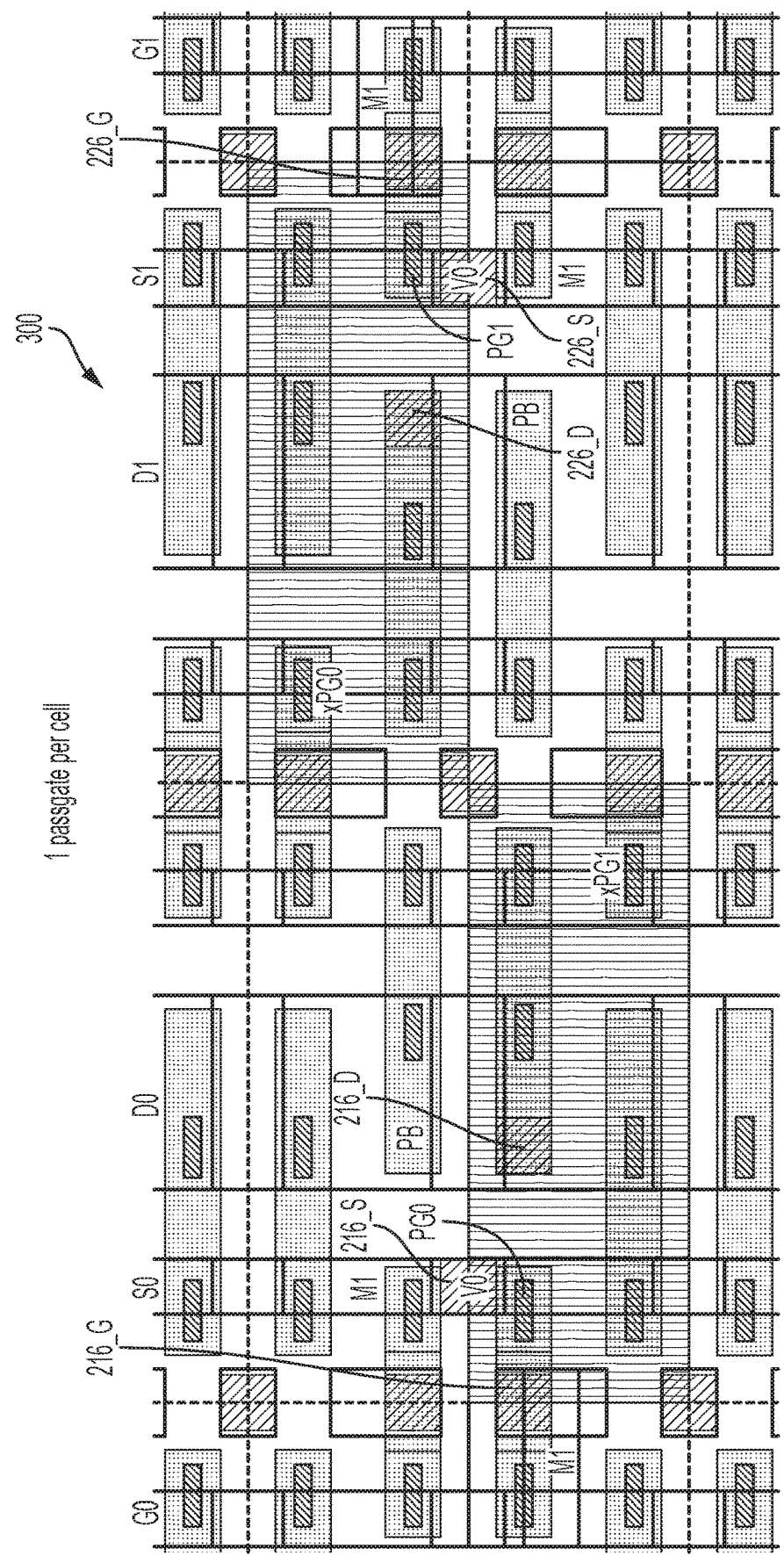
FIG. 3A depicts an example layout of a portion of the schematic in FIG. 2 according to one or more embodiments of the invention.
Figure 3B:
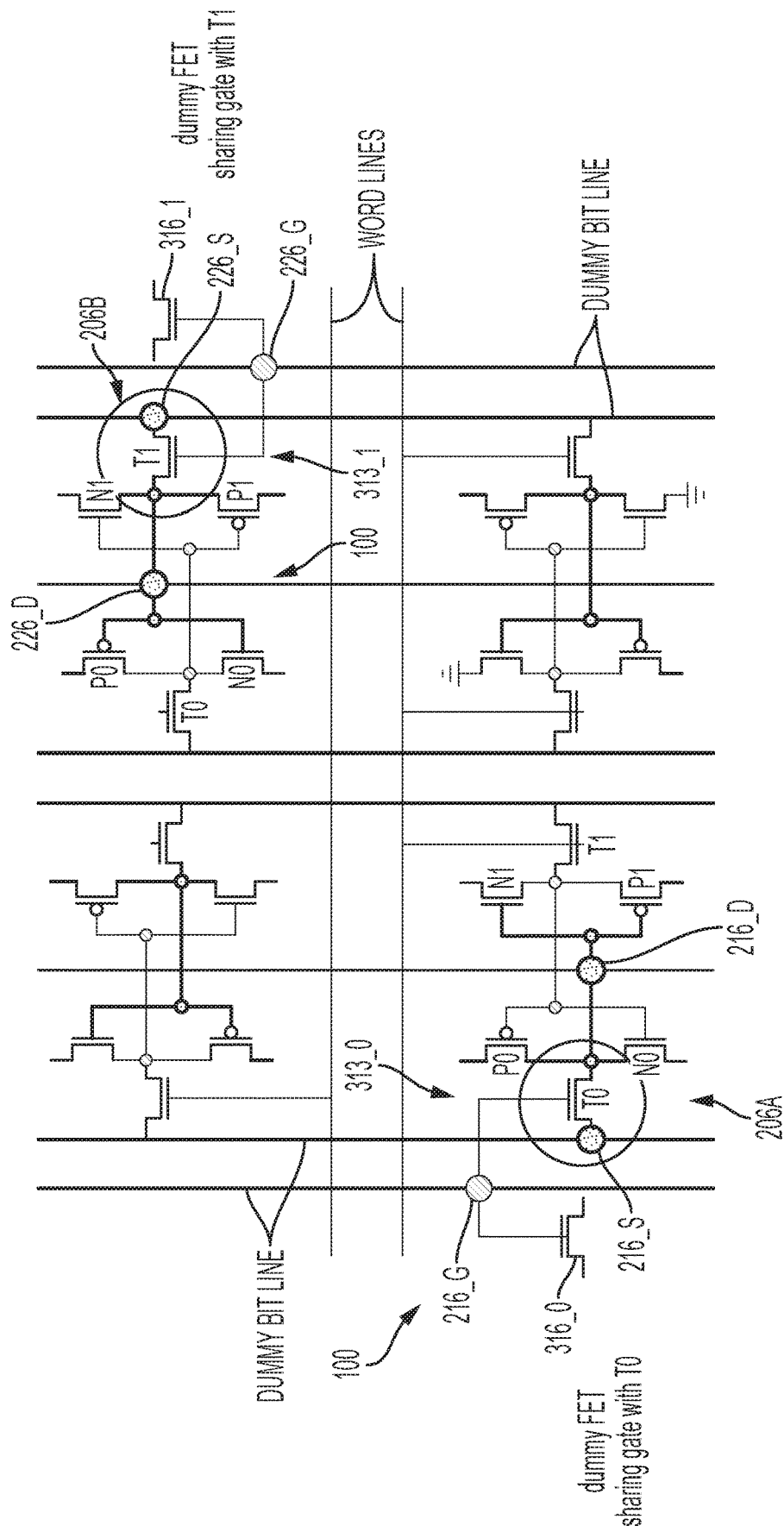
FIG. 3B depicts a schematic identifying a technique to individually probe/measure a pass gate transistor according to one or more embodiments of the invention.

FIG. 3A depicts an example layout 300 of a portion of the schematic of the semiconductor device 200 according to one or more embodiments of the invention. FIG. 3B depicts a schematic identifying a technique to individually probe/measure pass gates T0 and T1 according to one or more embodiments of the invention. Example probe points for pass gates T0 and T1 are respectively depicted in FIGS. 3A, 3B, 3C, and 4. A probe point is the location at which a probe electrically connects to and/or taps into the semiconductor device 200 to measure the terminals of an individual FET in a single SRAM 100. Since a transistor is a 3 terminal device having a source, a drain, and a gate (and sometimes a body terminal), 3 probe point/taps/leads are utilized to measure the operation of a single transistor in a single SRAM 100, and FIG. 12 represents example measurement/testing devices which can be utilized to probe transistors according to one or more embodiments.

FIGS. 3A and 3B show probe point 216_S (e.g., source probe point), probe point 216_D (e.g., drain probe point), and probe point 216_G (e.g., gate probe point) for a pass gate T0. Also, FIGS. 3A and 3B show probe point 226_S (e.g., source probe point), probe point 226_D (e.g., drain probe point), and probe point 226_G (e.g., gate probe point) for a pass gate T1. FIG. 3B illustrates a dummy FET 316_0 having its gate coupled to the gate of the pass gate T0 in the circle 206A and a dummy FET 316_1 having its gate coupled to the gate of the pass gate T1 in the circle 206B.

Figure 3C:
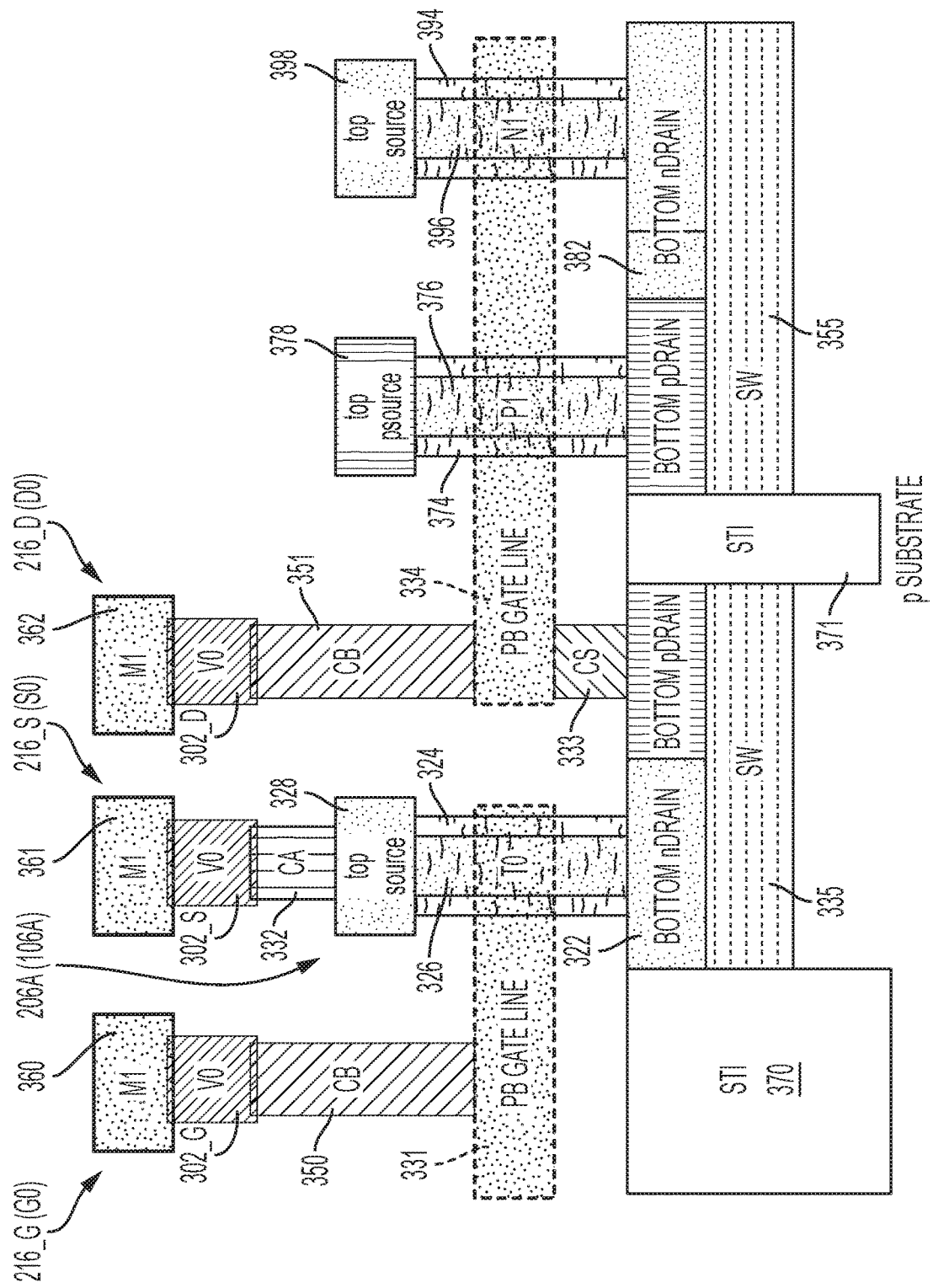
FIG. 3C depicts a block diagram of an example stacked view of a pass gate transistor (T0) according to one or more embodiments of the invention.

FIG. 3C depicts a block diagram of an example stacked view of a pass gate T0, such as FET 106A, according to one or more embodiments of the invention. VFETs are illustrated in FIGS. 3C and 4. In FIG. 3C, the FET 106A (T0) has a bottom drain 322, a gate 324 (known as the so-called all-around gate) that wraps around a channel 326 of the vertical FET. A top source 328 is on top of the channel 326. The vertical FET is sometimes called a vertical nanotube if the channel 326 is round. The channel 326 can be a semiconductor material. The top source 328 and bottom drain 322 of the VFET are formed with highly doped epitaxial material, such as highly doped silicon. The bottom drain 322 has an n-type portion connected to a p-type portion. The p-type portion of the bottom drain 322 is connected to the bottom surface of the channel 326. Although the FET 106A is shown as being formed on a p-type substrate, other types of substrates can be utilized.

A PB gate line 331 connects to the gate 324 (e.g., the all-around-gate) but the PB gate line 331 is not the FET gate 324. The source 328 on top is contacted by a metallic layer called metallic layer CA 332, which is a metallic-filled via. The p-type portion of the bottom drain 322 is contacted by a metallic layer CS (or could be CR) 333, which is a metallic-filled via. The metallic CS 333 is the so-called buried contact, which connects the bottom drain 322 to a PB gate line 334. The metallic CS 333 is buried under the PB gate line 334.

A shallow well (SW) 335 is formed to be n-type (N+ or n doped) and is electrically shorted to the N+ bottom drain 322 of the FET 106A (NFET). A metallic layer CB 350 is formed on top of the PB gate line 331, and a metallic layer CB 351 is formed on top of the PB gate line 334. A metallic layer V0 302_G is formed on top of a metallic layer CB 350, a metallic layer V0 302_S is formed on top of metallic layer CA 332, and metallic layer V0 302_D is formed on top of the metallic layer CB 351. Metal layer M1 360 is formed on top of metallic layer V0 302_G, metal layer M1 361 is formed on top of metallic layer V0 302_S, and metal layer M1 362 is formed on top of metallic layer V0 302_D.

A shallow trench isolation (STI) region 370 is on one end of the n-type portion of bottom drain 322, and another STI region 371 separates the bottom drain 322 from bottom drain 382. A gate 374 (e.g., the all-around-gate) wraps around a channel 376 for transistor P1, and a gate 394 (e.g., the all-around-gate) wraps around a channel 396 for transistor N1. The PB gate line 334 connects to the gate 374 and gate 394. A top source 378 is on top of the channel 376 and gate 374, while the channel 376 and gate 374 are on top of the p-type portion of the bottom drain 382. A top source 398 is on top of the channel 396 and gate 394, while the channel 396 and gate 394 are on top of the n-type portion of the bottom drain 382. A shallow well (SW) 355 is formed to be n-type (N+ or n doped) and is electrically shorted to the N+ bottom portion of drain 382.

FIG. 4 depicts a block diagram of an example stacked view of a pass gate T1, such as FET 106B, according to one or more embodiments of the invention. For the VFET in FIG. 4, the FET 106B (T1) has a bottom drain 422, a gate 424 (known as an all-around gate) that wraps around a channel 426 of the vertical FET. A top source 428 is on top of the channel 426. The vertical FET is a vertical nanotube if the channel 426 is round. The channel 426 can be a semiconductor material. The top source 428 and bottom drain 422 of the VFET are formed with highly doped epitaxial material, such as highly doped silicon. The bottom drain 422 has an n-type portion connected to a p-type portion. The p-type portion of the bottom drain 422 is connected to the bottom surface of the channel 426.

A PB gate line 431 connects to the gate 424 (e.g., the all-around-gate. The source 428 on top is contacted by a metallic layer called metallic layer CA 432. The p-type portion of the bottom drain 422 is contacted by a metallic layer CS (or could be CR) 433. The metallic CS 433 is the so-called buried contact, which connects the bottom drain 422 to a PB gate line 434. The metallic CS 433 is buried under the PB gate line 434.

A shallow well (SW) 435 is formed to be n-type (N+ or n doped) and is electrically shorted to the N+ bottom drain 422 of the FET 106B (NFET). A metallic layer CB 450 is formed on top of the PB gate line 431, and a metallic layer CB 451 is formed on top of the PB gate line 434. A metallic layer V0 402_G (e.g., gate contact) is formed on top of metallic layer CB 450, a metallic layer V0 402_S (e.g., source contact) is formed on top of metallic layer CA 432, and a metallic layer V0 402_D (e.g., drain contact) is formed on top of the metallic layer CB 451. Metal layer M1 462 is formed on top of metallic layer V0 402_D, metal layer M1 461 is formed on top of metallic layer V0 402_S, and metal layer M1 460 is formed on top of metallic layer V0 402_G.

A shallow trench isolation (STI) region 470 is on one end of the n-type portion of bottom drain 422, and another STI region 471 separates the bottom drain 422 from bottom drain 482. A gate 474 (e.g., the all-around-gate) wraps around a channel 476 for transistor P0, and a gate 494 (e.g., the all-around-gate) wraps around a channel 496 for transistor N0. The PB gate line 434 connects to the gate 474 and gate 494. A top source 478 is on top of the channel 476 and gate 474, while the channel 476 and gate 474 are on top of the p-type portion of the bottom drain 482. A top source 498 is on top of the channel 496 and gate 494, while the channel 496 and gate 494 are on top of the n-type portion of the bottom drain 482. A shallow well (SW) 455 is formed to be n-type (N+ or n doped) and is electrically shorted to the N+ bottom portion of drain 482.

Figure 5A:
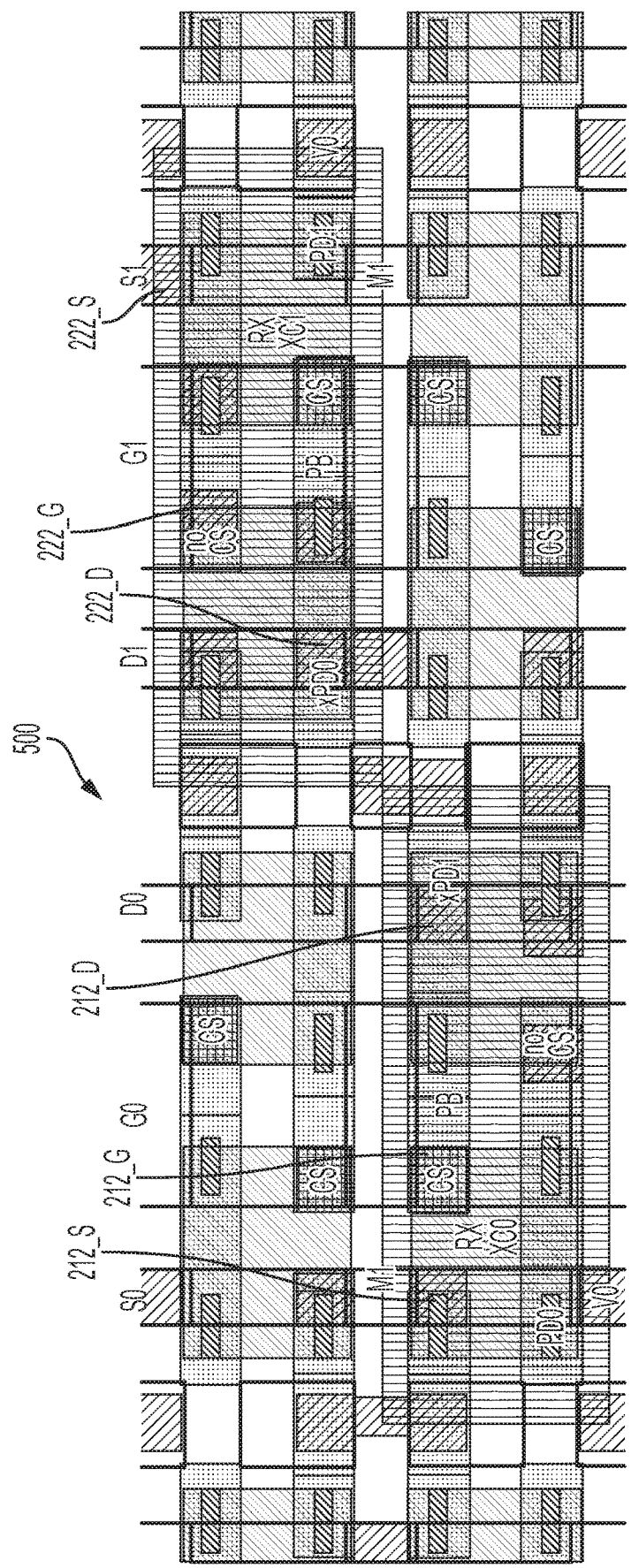
FIG. 5A depicts an example layout of a portion of the schematic in FIG. 2 according to one or more embodiments of the invention.
Figure 5B:
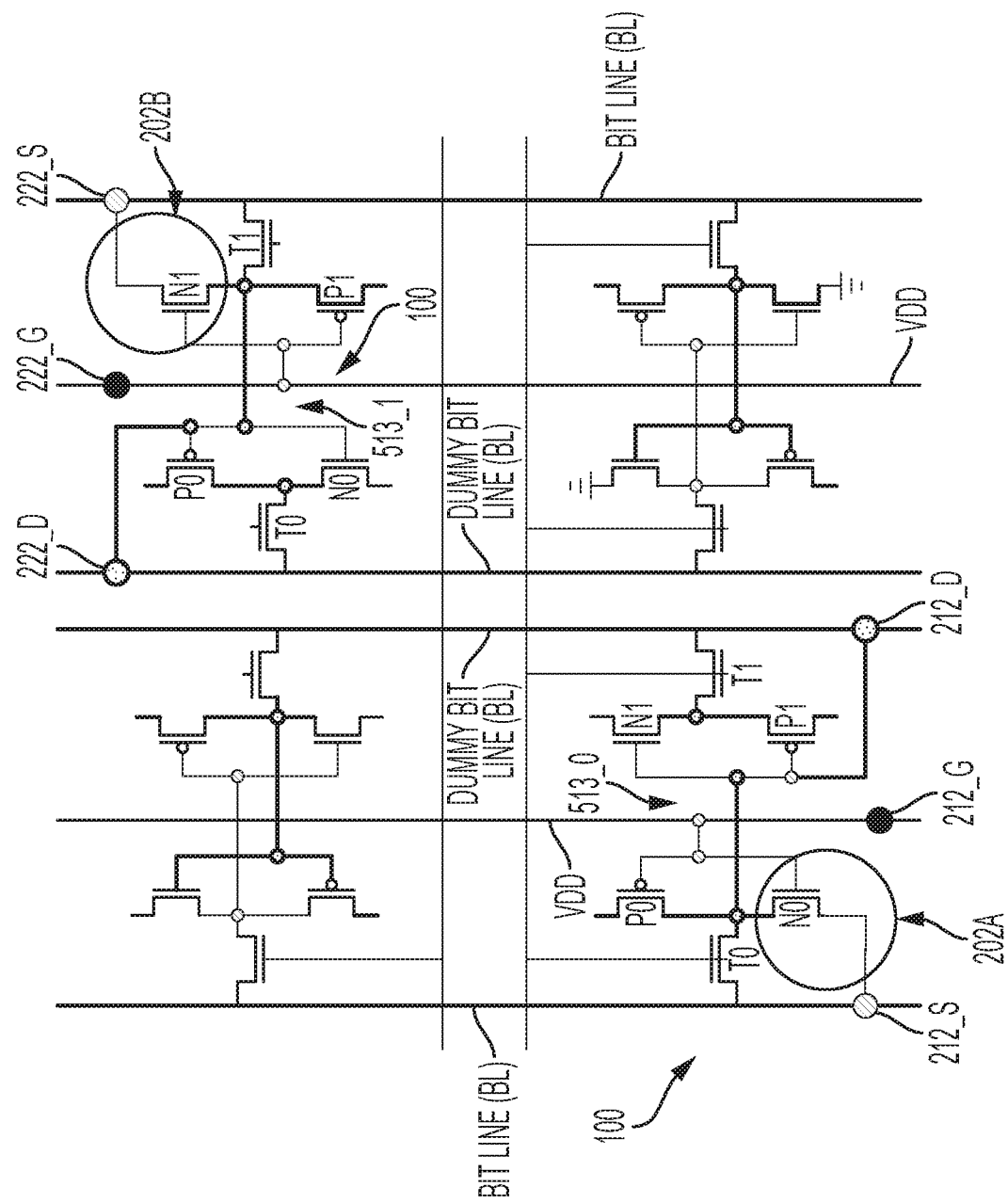
FIG. 5B depicts a schematic identifying a technique to individually probe/measure pulldown transistors according to one or more embodiments of the invention.
Figure 6:
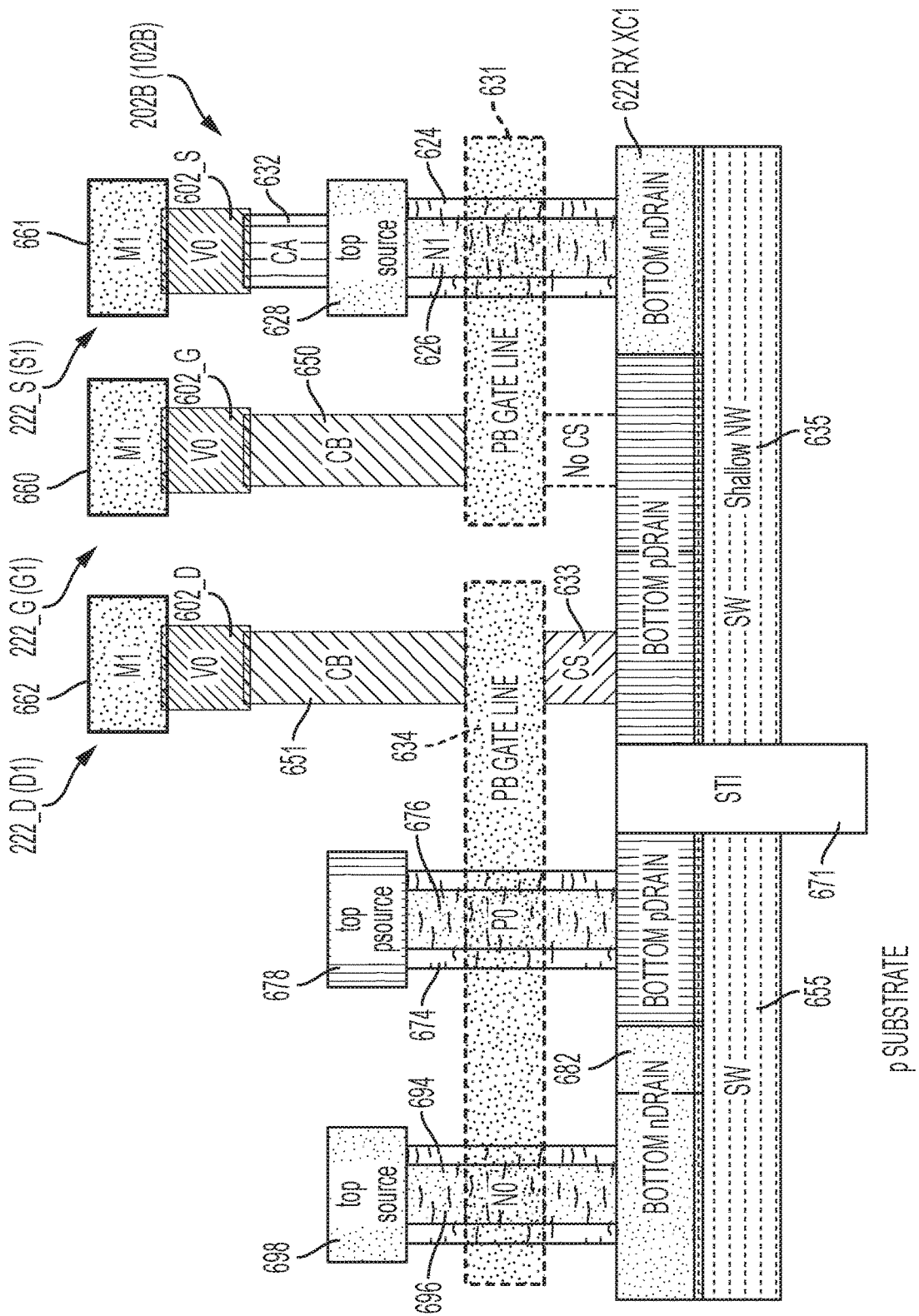
FIG. 6 depicts a block diagram of an example stacked view of a pulldown transistor (N1) according to one or more embodiments of the invention.

FIG. 5A depicts an example layout 500 of a portion of the schematic of the semiconductor device 200 according to one or more embodiments of the invention. FIG. 5B depicts a schematic identifying a technique to individually probe/measure pulldown transistors N0 and N1 according to one or more embodiments of the invention. Example probe points for transistors N0 and N1 are respectively depicted in FIGS. 5A, 5B, 5C, and 6. FIGS. 5A and 5B show probe point 212_S (e.g., source probe point), probe point 212_D (e.g., drain probe point), and probe point 212_G (e.g., gate probe point) for a transistor N0. Also, FIGS. 5A and 5B show probe point 222_S (e.g., source probe point), probe point 222_D (e.g., drain probe point), and probe point 222_G (e.g., gate probe point) for a transistor N1. FIG. 5C depicts a block diagram of an example stacked view of a transistor N0, such as FET 102A, according to one or more embodiments of the invention. VFETs are illustrated in FIGS. 5C and 6. In FIG. 5C, the FET 102A (N0) has a bottom drain 522 (e.g., RX XC0), and a gate 524 (known as the so-called all-around gate) that wraps around a channel 526 of the vertical FET. A top source 528 is on top of the channel 526. The vertical FET is sometimes called a vertical nanotube when the channel 526 is round. The channel 526 can be a semiconductor material. The top source 528 and bottom drain 522 of the VFET are formed with highly doped epitaxial material, such as highly doped silicon. The bottom drain 522 has an n-type portion connected to a p-type portion. The n-type portion of the bottom drain 522 is connected to the bottom surface of the channel 526.

A PB gate line 531 connects to the gate 524 (e.g., the all-around-gate). The source 528 on top is contacted by a metallic layer called metallic layer CA 532. The p-type portion of the bottom drain 522 is connected to a metallic layer CS (or could be CR) 533. The metallic CS 533 is the buried contact, which connects the bottom drain 522 to a PB gate line 534. The metallic CS 533 is buried under the PB gate line 534.

A shallow well (SW) 535 is formed to be n-type (N+ or n doped) and is electrically shorted to the N+ bottom drain 522 of the FET 102A (NFET). The shallow well can be formed on a p-type substrate, although other substrates can be utilized. A metallic layer CB 550 is formed on top of the PB gate line 531, and a metallic layer CB 551 is formed on top of the PB gate line 534. A metallic layer V0 502_G is formed on top of metallic layer CB 550, a metallic layer V0 502_S is formed on top of metallic layer CA 532, and metallic layer V0 502_D is formed on top of the metallic layer CB 551. Metal layer M1 560 is formed on top of metallic layer V0 502_G, metal layer M1 561 is formed on top of metallic layer V0 502_S, and metal layer M1 562 is formed on top of metallic layer V0 502_D.

A shallow trench isolation (STI) region 571 separates the bottom drain 522 from bottom drain 582. A gate 574 (e.g., the all-around-gate) wraps around a channel 576 for transistor P1, and a gate 594 (e.g., the all-around-gate) wraps around a channel 596 for transistor N1. The PB gate line 534 connects to the gate 574 and gate 594. A top source 578 is on top of the channel 576 and gate 574, while the channel 576 and gate 574 are on top of the p-type portion of the bottom drain 582. A top source 598 is on top of the channel 596 and gate 594, while the channel 596 and gate 594 are on top of the n-type portion of the bottom drain 582. A shallow well (SW) 555 is formed to be n-type (N+ or n doped) and is electrically shorted to the n-type portion (N+) of bottom drain 582.

FIG. 6 depicts a block diagram of an example stacked view of a transistor N1, such as FET 102B, according to one or more embodiments of the invention. For the VFET in FIG. 6, the FET 102B (N1) has a bottom drain 622, a gate 624 (known as the all-around gate) that wraps around a channel 626 of the vertical FET. A top source 628 is on top of the channel 626. The vertical FET is called a vertical nanotube if the channel 626 is round. The channel 626 can be a semiconductor material. The top source 628 and bottom drain 622 of the VFET are formed with highly doped epitaxial material, such as highly doped silicon. The bottom drain 622 has an n-type portion connected to a p-type portion. The n-type portion of the bottom drain 622 is connected to the bottom surface of the channel 626.

A PB gate line 631 connects to the gate 624 (e.g., the all-around-gate). The source 628 on top is contacted by a metallic layer called metallic layer CA 632. The p-type portion of the bottom drain 622 is contacted by a metallic layer CS (or could be CR) 633. The metallic CS 633 is the buried contact, which connects the bottom drain 622 to a PB gate line 634. The metallic CS 633 is buried under the PB gate line 634.

A shallow well (SW) 635 is formed to be n-type (N+ or n doped) and is electrically shorted to the n-type portion (N+) of the bottom drain 622 of the FET 102B (NFET). The shallow well can be formed on a p-type substrate, although other substrates can be utilized. A metallic layer CB 650 is formed on top of the PB gate line 631, and a metallic layer CB 651 is formed on top of the PB gate line 634. A metallic layer V0 602_G (e.g., gate contact) is formed on top of metallic layer CB 650, a metallic layer V0 602_S (e.g., source contact) is formed on top of metallic layer CA 632, and a metallic layer V0 602_D (e.g., drain contact) is formed on top of the metallic layer CB 651. Metal layer M1 662 is formed on top of metallic layer V0 602_D, metal layer M1

661 is formed on top of metallic layer V0 602_S, and metal layer M1 660 is formed on top of metallic layer V0 602_G.

A shallow trench isolation (STI) region 671 separates the bottom drain 622 from bottom drain 682. A gate 674 (e.g., the all-around-gate) wraps around a channel 676 for transistor P0, and a gate 694 (e.g., the all-around-gate) wraps around a channel 696 for transistor N0. The PB gate line 634 connects to the gate 674 and gate 694. A top source 678 is on top of the channel 676 and gate 674, while the channel 676 and gate 674 are on top of the p-type portion of the bottom drain 682. A top source 698 is on top of the channel 696 and gate 694, while the channel 696 and gate 694 are on top of the n-type portion of the bottom drain 682. A shallow well (SW) 655 is formed to be n-type (N+ or n doped) and is electrically shorted to the N+ bottom portion of drain 682.

Figure 7A:
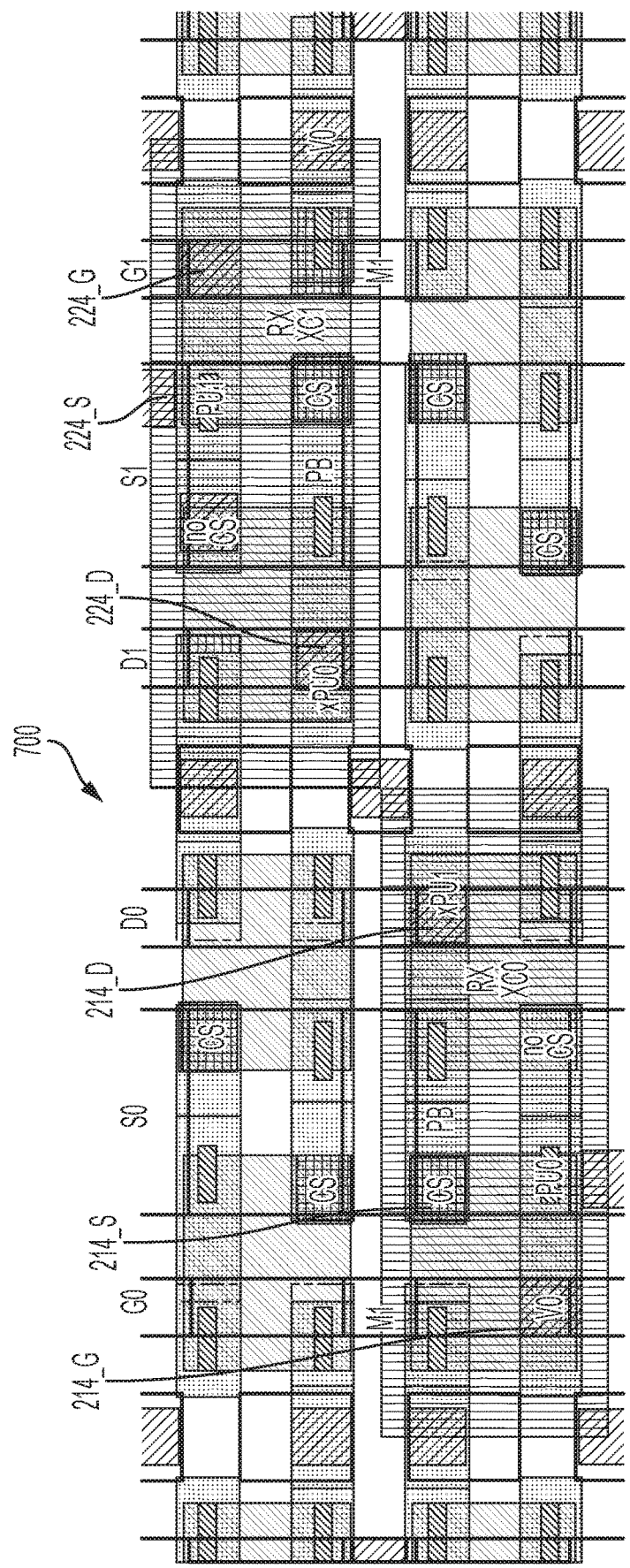
FIG. 7A depicts an example layout of a portion of the schematic in FIG. 2 according to one or more embodiments of the invention.
Figure 7B:
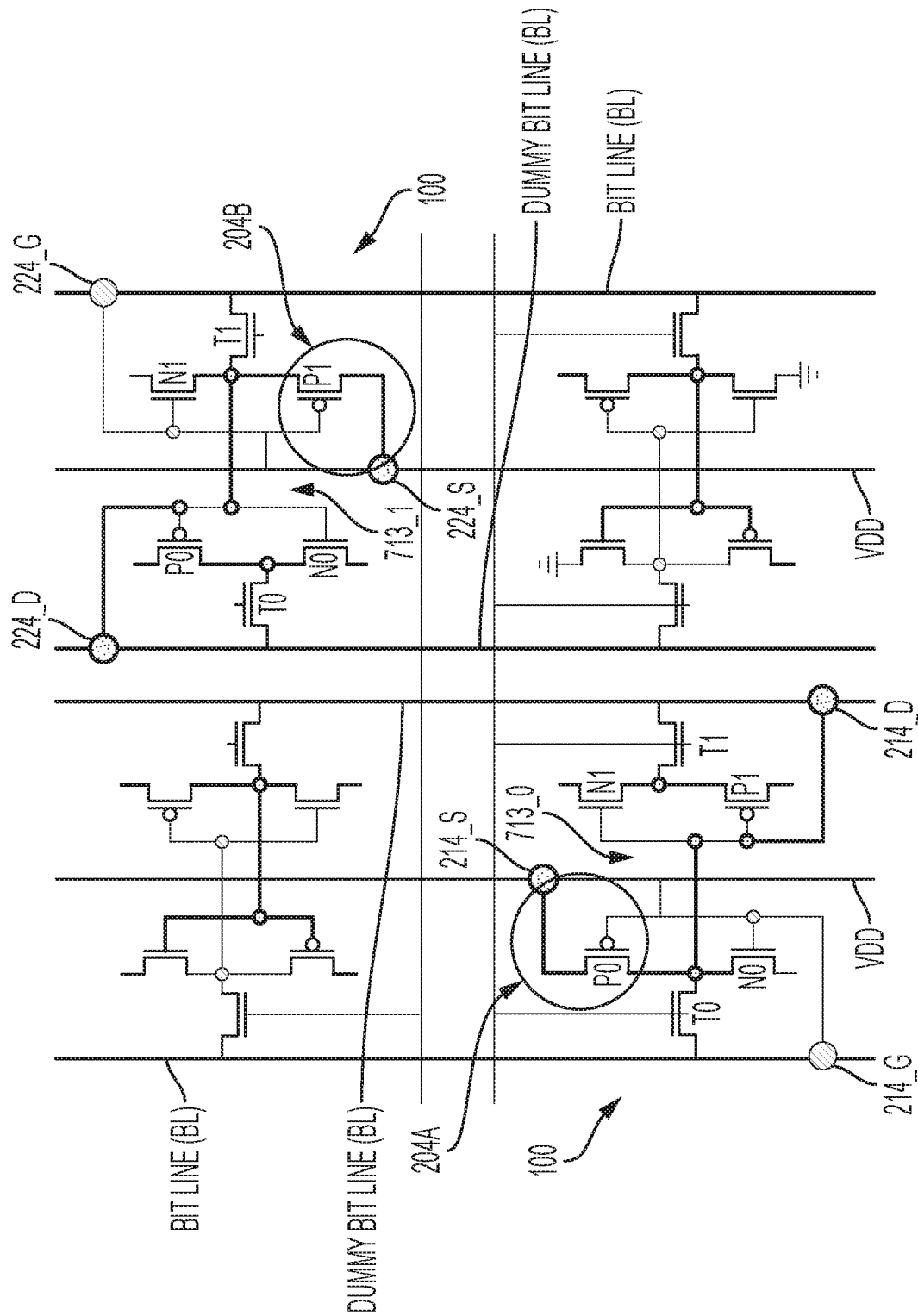
FIG. 7B depicts a schematic identifying a technique to individually probe/measure pullup transistors according to one or more embodiments of the invention.

FIG. 7A depicts an example layout 700 of a portion of the schematic of the semiconductor device 200 according to one or more embodiments of the invention. FIG. 7B depicts a schematic identifying a technique to individually probe/ measure pullup transistors P0 and P1 according to one or more embodiments of the invention. Example probe points for transistors P0 and P1 are respectively depicted in FIGS. 7A, 7B, 7C, and 8 to measure the operation of a single transistor in a single SRAM 100.

Figure 7C:
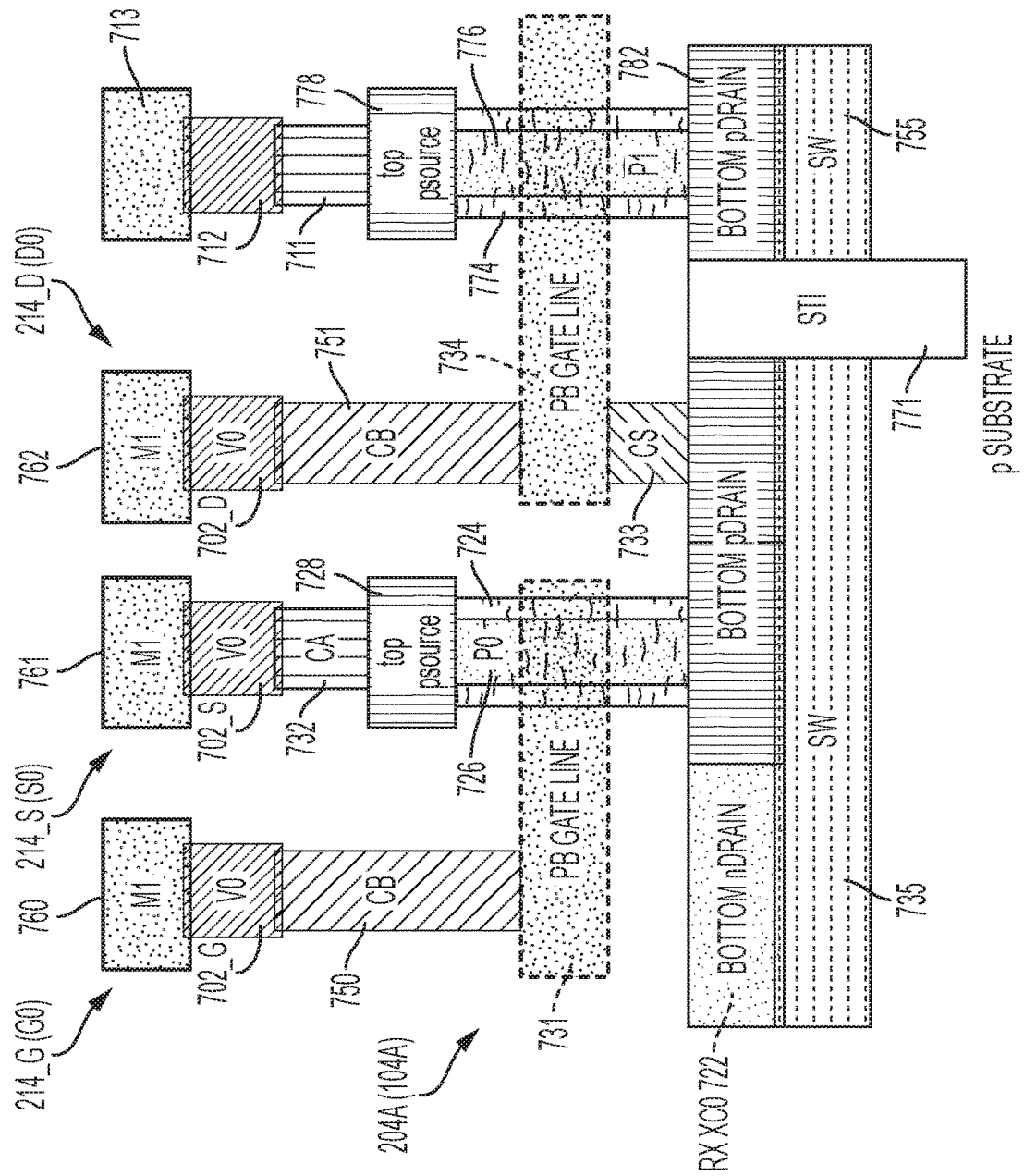
FIG. 7C depicts a block diagram of an example stacked view of a pullup transistor (P0) according to one or more embodiments of the invention.
Figure 8:
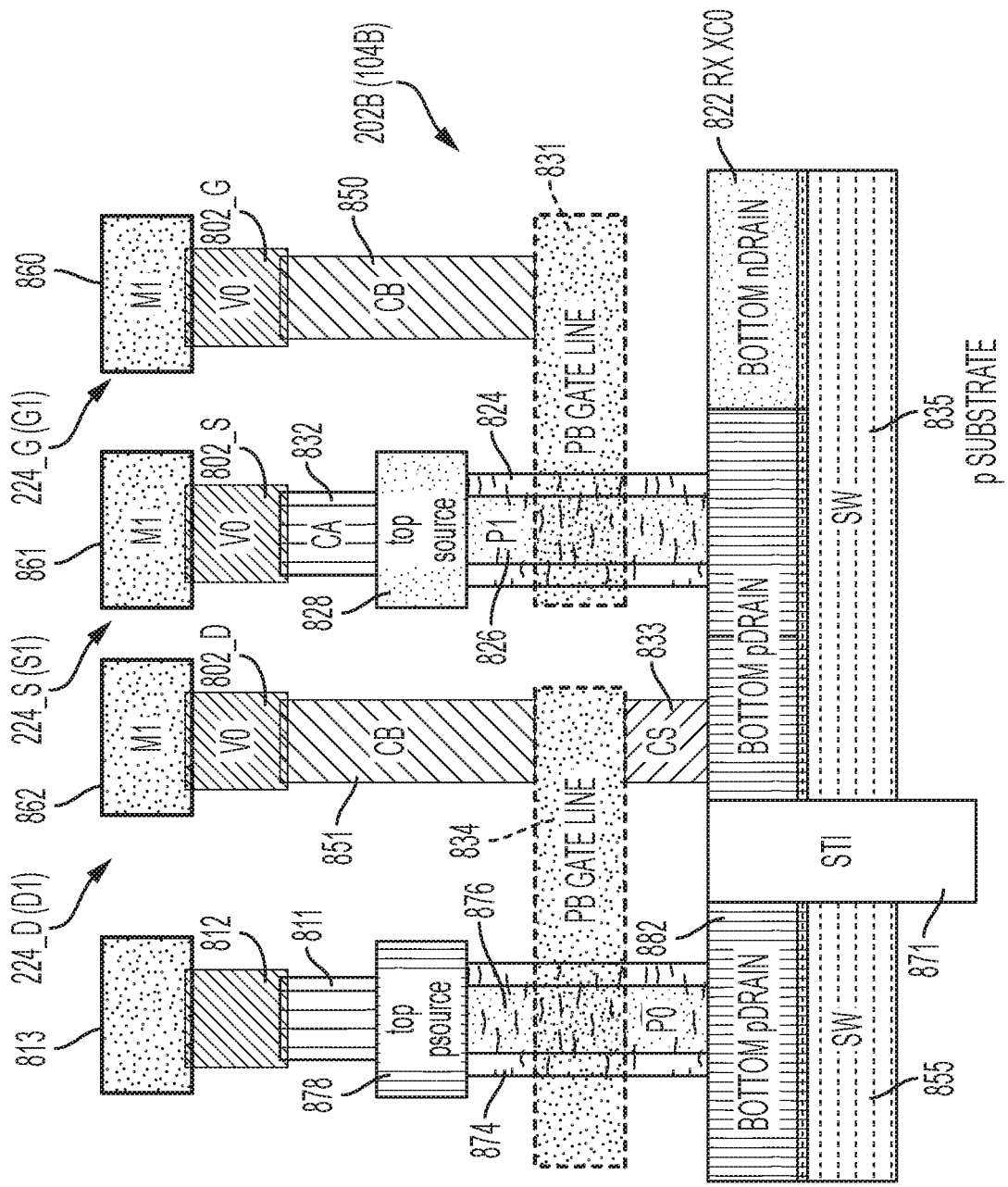
FIG. 8 depicts a block diagram of an example stacked view of a pullup transistor (P1) according to one or more embodiments of the invention.

FIGS. 7A and 7B show probe point 214_S (e.g., source probe point), probe point 214_D (e.g., drain probe point), and probe point 214_G (e.g., gate probe point) for a transistor P0. Also, FIGS. 7A and 7B show probe point 224_S (e.g., source probe point), probe point 224_D (e.g., drain probe point), and probe point 224_G (e.g., gate probe point) for a transistor P1. FIG. 7C depicts a block diagram of an example stacked view of a transistor P0, such as FET 104A, according to one or more embodiments of the invention. VFETs are illustrated in FIGS. 7C and 8. In FIG. 7C, the FET 104A (P0) has a bottom drain 722 (e.g., RX XC0), a gate 724 (e.g., all-around gate) that wraps around a channel 726 of the vertical FET. A top source 728 is on top of the channel 726. The vertical FET is called a vertical nanotube if the channel 726 is round. The channel 726 can be a semiconductor material. The top source 728 and bottom drain 722 of the VFET are formed with highly doped epitaxial material, such as highly doped silicon. The bottom drain 722 has an n-type portion connected to a p-type portion. The p-type portion of the bottom drain 722 is connected to the bottom surface of the channel 726.

A PB gate line 731 connects to the gate 724 (e.g., the all-around-gate). The source 728 on top is contacted by a metallic layer called metallic layer CA 732. The p-type portion of the bottom drain 722 is connected to a metallic layer CS (or could be CR) 733. The metallic CS 733 is the buried contact, which connects the bottom drain 722 to a PB gate line 734. The metallic CS 733 is buried under the PB gate line 734.

A shallow well (SW) 735 is formed to be n-type (N+ or n doped) and is electrically shorted to the P+ bottom portion of drain 722 of the FET 104A (PFET). A metallic layer CB 750 is formed on top of the PB gate line 731, and a metallic layer CB 751 is formed on top of the PB gate line 734. A metallic layer V0 702_G is formed on top of metallic layer CB 750, a metallic layer V0 702_S is formed on top of metallic layer CA 732, and metallic layer V0 702_D is formed on top of the metallic layer CB 751. Metal layer M1 760 is formed on top of metallic layer V0 702_G, metal layer M1 761 is formed on top of metallic layer V0 702_S, and metal layer M1 762 is formed on top of metallic layer V0 702_D.

A shallow trench isolation (STI) region 771 separates the bottom drain 722 from bottom drain 782. A gate 774 (e.g., the all-around-gate) wraps around a channel 776 for transistor P1. The PB gate line 734 connects to the gate 774. A top source 778 is on top of the channel 676 and gate 674, while the channel 776 and gate 774 are on top of the bottom drain 782. A metallic layer 711 is formed on top of the top source 778, and metallic layer V0 712 is formed on top of metallic layer 711. Metal layer 713 is formed on top of metallic layer V0 712. A shallow well (SW) 755 is formed to be n-type (N+ or n doped) and is electrically shorted to the p-type bottom drain 782. The shallow wells are formed on a p-type substrate, although other substrates can be utilized.

FIG. 8 depicts a block diagram of an example stacked view of a transistor P1, such as FET 104B, according to one or more embodiments of the invention. For the VFET in FIG. 8, the FET 104B (P1) has a bottom drain 822, a gate 824 (e.g., all-around gate) that wraps around a channel 826 of the vertical FET. A top source 828 is on top of the channel 826, which can be round vertical nanotube. The channel 826 can be a semiconductor material. The top source 828 and bottom drain 822 of the VFET are formed with highly doped epitaxial material, such as highly doped silicon. The bottom drain 822 has an n-type portion connected to a p-type portion. The p-type portion of the bottom drain 822 is connected to the bottom surface of the channel 826.

A PB gate line 831 connects to the gate 824 (e.g., the all-around-gate). The top source 828 is contacted by a metallic layer called metallic layer CA 832. The p-type portion of the bottom drain 822 is contacted by a metallic layer CS (or could be CR) 833. The metallic CS 833 is a buried contact, which connects the bottom drain 822 to a PB gate line 834.

A shallow well (SW) 835 is formed to be n-type (N+ or n doped) and is electrically shorted to the n-type portion (N+) of the bottom drain 822 of the FET 104B (PFET). A metallic layer CB 850 is formed on top of the PB gate line 831, and a metallic layer CB 851 is formed on top of the PB gate line 834. A metallic layer V0 802_G (e.g., gate contact) is formed on top of metallic layer CB 850, a metallic layer V0 802_S (e.g., source contact) is formed on top of metallic layer CA 832, and a metallic layer V0 802_D (e.g., drain contact) is formed on top of the metallic layer CB 851. Metal layer M1 862 is formed on top of metallic layer V0 802_D, metal layer M1 861 is formed on top of metallic layer V0 802_S, and metal layer M1 860 is formed on top of metallic layer V0 802_G.

A shallow trench isolation (STI) region 871 separates the bottom drain 822 from bottom drain 882. A gate 874 (e.g., the all-around-gate) wraps around a channel 876 for transistor P0. The PB gate line 834 connects to the gate 874. A top source 878 is on top of the channel 876 and gate 874, while the channel 876 and gate 874 are on top of the p-type bottom drain 882. A metallic layer 811 is formed on top of the source 878, and a metallic-filled via 812 is formed on top of the metallic layer 811. A metal layer 813 is formed on top of the metallic-filled via 812. A shallow well (SW) 855 is formed to be n-type (N+ or n doped) and connected to the p+ bottom drain 882. The shallow wells are formed on a p-type substrate, although other substrates can be utilized.

FIG. 12 depicts greatly simplified representations of example testing/measurement devices 1200 which can be utilized to test and measure the transistors discussed herein according to one or more embodiments. The testing/measurement devices 1200 are electronic test equipment is used to create signals and capture responses from electronic devices under test (DUTs) or circuits under test, such as transistors T0, T1, N0, N1, P0, P1. The testing/measurement devices 1200 can test for voltage, current, inductance, capacitance, resistance, etc., in the circuit under test or DUT. The testing/measurement devices 1200 can represent and include the functionality of various pieces of equipment including voltmeters, ohmmeters, ammeters, LCR meters, etc. The testing/measurement devices 1200 could also include or be representative of various supply electronic equipment including power supplies, signal generators, etc. The testing/measurement devices 1200 have test probes/leads 1202 for physically and electrically connecting to the circuit of the transistors. A test probe is a physical device used to connect electronic test equipment to the DUT or circuit under test. A test probe is often supplied as a test lead, which includes the probe, cable, and terminating connector.

FIG. 9 depicts a flowchart of a method 900 of probing a pass gate transistor (e.g., pass gate transistors 106A (T0) and 106B (T1)) in a static random access memory (SRAM) circuit 100. At block 902, a gate probe (e.g., at probe point 216_G, probe point 226_G) is connected to a gate metal layer (e.g., metal layer M1 360, metal layer M1 460) of the SRAM circuit 100, the gate metal layer being coupled to a gate (e.g., gate 324, 424) of the pass gate transistor. At block 904, a source probe (e.g., at probe point 216_S, probe point 226_S) is connected to a source metal layer of the SRAM circuit 100, the source metal layer (e.g., metal layer M1 361, metal layer M1 461) being coupled to a source (e.g., source 328, 428) of the pass gate transistor. At block 906, a drain probe (e.g., at probe point 216_D, probe point 226_D) is connected to a drain metal layer (e.g., metal layer M1 362, metal layer M1 462) of the SRAM circuit 100, the drain metal layer being coupled to a drain (e.g., drain 322, 422) of the pass gate transistor, the SRAM circuit 100 including other transistors along with the pass gate transistor. At block 908, probing of the other transistors is avoided or not performed in same/single SRAM circuit 100, the other transistors being free from connections for the probing so as not to cause the other transistors to have an unwanted effect on the pass gate transistor (e.g., pass gate transistor 106A (T0) or pass gate transistor 106B (T1)) being probed. The probing of each pass gate transistor 106A (T0) and pass gate transistor 106B (T1) is performed separately in its own SRAM circuit.

The gate probe, the source probe, and the drain probe (e.g., probes/leads 1202) are operatively connected to the pass gate transistor for measuring the pass gate transistor. The other transistors are not operatively connected for measurements. Other SRAM circuits 100 are in a device 200 with the SRAM circuit 100. The other SRAM circuits 100 are dummy cells. The dummy cells are inactive and the SRAM circuit 100 is active.

The gate of the pass gate transistor can be disconnected from a word line, the word line being a higher level metal layer than the gate metal layer (e.g., metal layer M1 360, metal layer M1 460). For example, FIG. 3B shows that the pass gate transistor T0 has its gate disconnected from the word line illustrated by gate disconnection 313_0. Similarly, FIG. 3B shows that the pass gate transistor T1 has its gate disconnected from the word line illustrated by gate disconnection 313_1. Disconnecting the gate of the pass gate transistor from the word line includes removing a metal-filled via connecting the higher level metal layer to the gate metal layer. For example, the word line which is the higher level metal layer is similar to metal layer M1 360, 460 but on the second level as a metal layer M2, and the metal layer M2 is connected to the metal layer M1 by a metal-filled via V1 (like metal-filled via V0). However, the metal-filled via V1 is removed, thereby disconnecting the gate of the pass gate transistor from the word line. When the high level is not fabricated, the pass gate transistor can be probed without removing metal-filled via V1.

FIG. 10 depicts a flowchart of a method 1000 of probing a pulldown transistor (e.g., pulldown transistors 102A (N0) and 102B (N1)) in a static random access memory (SRAM) circuit 100 according to one or more embodiments of the invention. At block 1002, a gate probe (e.g., at probe point 212_G, probe point 222_G) is connected to a gate metal layer (e.g., metal layer M1 560, metal layer M1 660) of the SRAM circuit 100, the gate metal layer being coupled to a gate (e.g., gate 524, 624) of the pulldown transistor. At block 1004, a source probe (e.g., at probe point 212_S, probe point 222_S) is connected to a source metal layer (e.g., metal layer M1 561, metal layer M1 661) of the SRAM circuit 100, the source metal layer being coupled to a source (e.g., source 528, 628) of the pulldown transistor. At block 1006, a drain probe (e.g., at probe point 212_D, probe point 222_D) to a drain metal layer (e.g., metal layer M1 562, metal layer M1 662) of the SRAM circuit 100, the drain metal layer being coupled to a drain (e.g., drain 522, 622) of the pulldown transistor, the SRAM circuit 100 including other transistors along with the pulldown transistor. At block 1008, probing of the other transistors is avoided or not performed in the SRAM circuit 100, the other transistors being free from connections for the probing so as not to cause the other transistors to have an unwanted effect on the pulldown transistor (e.g., pulldown transistors 102A (N0) and 102B (N1)) being probed. The probing of each pulldown transistors 102A (N0) and 102B (N1) is performed separately in its own SRAM circuit.

The gate probe, the source probe, and the drain probe (e.g., probes/leads 1202) are operatively connected to the pulldown transistor for measuring the pulldown transistor. The other transistors are not operatively connected for measurements. Other SRAM circuits 100 are in a device 200 with the SRAM circuit 100, the other SRAM circuits 100 being dummy cells. The dummy cells are inactive and the SRAM circuit 100 is active.

The gate of the pulldown transistor can be disconnected from a pass gate transistor and an inverter, the pass gate transistor and the inverter being part of the other transistors in the SRAM circuit 100, and connecting the gate of the pulldown transistor to a voltage supply (e.g., voltage supply VDD). For example, FIG. 5B shows that the pulldown transistor N0 has its gate disconnected from the drain of pass gate transistor T1 and disconnected from the inverter formed by transistors N1 and P1, as illustrated by gate disconnection 513_0. Similarly, FIG. 5B shows that the pulldown transistor N1 has its gate disconnected from the drain of pass gate transistor T0 and disconnected from the inverter formed by transistors N0 and P0, as illustrated by gate disconnection 513_1. Also, the method includes connecting a drain of the pulldown transistor to a dummy bit line on a side of the inverter and a gate of an opposite pulldown transistor in the inverter. For example, FIG. 5B shows that the drain (e.g., at probe point 212_D) of pulldown transistor N0 is coupled to a dummy bit line and the gate of opposite pulldown transistor N1 in the same SRAM circuit 100. Similarly, FIG. 5B shows that the drain (e.g., at probe point 222_D) of pulldown transistor N1 is coupled to a dummy bit line and the gate of opposite pulldown transistor N0 in the same SRAM circuit 100.

FIG. 11 depicts a flowchart of a method 1100 of probing a pullup transistor (e.g., pullup transistors 104A (P0) and 104B (P1)) in a static random access memory (SRAM)

circuit 100 according to one or more embodiments of the invention. At block 1102, a gate probe (e.g., at probe point 214_G, probe point 224_G) is connected to a gate metal layer (e.g., metal layer M1 760, metal layer M1 860) of the SRAM circuit 100, the gate metal layer being coupled to a gate (e.g., gate 724, 824) of the pullup transistor. At block 1104, a source probe (e.g., at probe point 214_S, probe point 224_S) is connected to a source metal layer (e.g., metal layer M1 761, metal layer M1 861) of the SRAM circuit 100, the source metal layer being coupled to a source (e.g., source 728, 828) of the pullup transistor. At block 1106, a drain probe (e.g., at probe point 214_D, probe point 224_D) is connected to a drain metal layer (e.g., metal layer M1 762, metal layer M1 862) of the SRAM circuit 100, the drain metal layer being coupled to a drain (e.g., drain 722, 822) of the pullup transistor, the SRAM circuit 100 including other transistors along with the pullup transistor. At block 1108, a probing of the other transistors is avoided in the SRAM circuit 100, the other transistors being free from connections for the probing so as not to cause the other transistors to have an unwanted effect on the pullup transistor (e.g., pullup transistors 104A (P0) and 104B (P1)) being probed. The probing of each pullup transistor 104A (P0) and 104B (P1) is performed separately in its own SRAM circuit.

The gate probe, the source probe, and the drain probe (e.g., probes/leads 1202) are operatively connected to the pullup transistor for measuring the pullup transistor. The other transistors are not operatively connected for measurements, and other SRAM circuits are in a device 200 with the SRAM circuit 100, the other SRAM circuits being dummy cells, the dummy cells being inactive, the SRAM circuit 100 being active.

The gate of the pullup transistor can be disconnected from a pass gate transistor and an inverter, the pass gate transistor and the inverter being part of the other transistors in the SRAM circuit. For example, FIG. 7B shows that the pullup transistor P0 has its gate disconnected from the drain of pass gate transistor T1 and disconnected from the inverter formed by transistors N1 and P1, as illustrated by gate disconnection 713_0. Similarly, FIG. 5B shows that the pullup transistor P1 has its gate disconnected from the drain of pass gate transistor T0 and disconnected from the inverter formed by transistors N0 and P0, as illustrated by gate disconnection 713_1. Also, the method includes connecting the gate of the pullup transistor to a bit line. The method includes connecting a drain of the pullup transistor to a dummy bit line on a side of the inverter and a gate of an opposite pullup transistor in the inverter. For example, FIG. 7B shows that the drain (e.g., at probe point 214_D) of pullup transistor P0 is coupled to a dummy bit line and the gate of opposite pullup transistor P1 in the same SRAM circuit 100. Similarly, FIG. 7B shows that the drain (e.g., at probe point 224_D) of pullup transistor P1 is coupled to a dummy bit line and the gate of opposite pullup transistor P0 in the same SRAM circuit 100.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of probing a pass gate transistor in a static random access memory (SRAM) circuit, the method comprising:

connecting a gate probe to a gate metal layer of the SRAM circuit, the gate metal layer being coupled to a gate of the pass gate transistor;

connecting a source probe to a source metal layer of the SRAM circuit, the source metal layer being coupled to a source of the pass gate transistor;

connecting a drain probe to a drain metal layer of the SRAM circuit, the drain metal layer being coupled to a drain of the pass gate transistor via a buried contact, the SRAM circuit comprising other transistors along with the pass gate transistor;

wherein the other transistors are free from connections for the probing so as not to cause the other transistors to have an unwanted effect on the pass gate transistor being probed.

2. The method of claim 1, wherein the gate probe, the source probe, and the drain probe are operatively connected to the pass gate transistor for measuring the pass gate transistor.

3. The method of claim 1, wherein the other transistors are not operatively connected for measurements.

4. The method of claim 1, wherein other SRAM circuits are in a same device with the SRAM circuit.

5. The method of claim 4, wherein the other SRAM circuits are dummy cells.

6. The method of claim 5, wherein the dummy cells are inactive and the SRAM circuit is active.

7. The method of claim 1 further comprising disconnecting the gate of the pass gate transistor from a word line, the word line being a higher level metal layer than the gate metal layer.

8. The method of claim 7, wherein disconnecting the gate of the pass gate transistor from the word line comprises removing a metal-filled via connecting the higher level metal layer to the gate metal layer.

9. A method of probing a pulldown transistor in a static random access memory (SRAM) circuit, the method comprising:
connecting a gate probe to a gate metal layer of the SRAM circuit, the gate metal layer being coupled to a gate of the pulldown transistor;
connecting a source probe to a source metal layer of the SRAM circuit, the source metal layer being coupled to a source of the pulldown transistor;
connecting a drain probe to a drain metal layer of the SRAM circuit, the drain metal layer being coupled to a drain of the pulldown transistor via a buried contact, the SRAM circuit comprising other transistors along with the pulldown transistor;
wherein the other transistors are free from connections for the probing so as not to cause the other transistors to have an unwanted effect on the pulldown transistor being probed.

10. The method of claim 9, wherein the gate probe, the source probe, and the drain probe are operatively connected to the pulldown transistor for measuring the pulldown transistor.

11. The method of claim 9, wherein the other transistors are not operatively connected for measurements.

12. The method of claim 9, wherein other SRAM circuits are in a same device with the SRAM circuit, the other SRAM circuits being dummy cells.

13. The method of claim 12, wherein the dummy cells are inactive and the SRAM circuit is active.

14. The method of claim 9 further comprising disconnecting the gate of the pulldown transistor from a pass gate transistor and an inverter, the pass gate transistor and the inverter being part of the other transistors in the SRAM circuit, the pass gate transistor in the SRAM circuit having a source terminal connected to a bit line; and
connecting the drain of the pulldown transistor to the bit line.

15. The method of claim 14 further comprising connecting the gate of the pulldown transistor to a voltage supply.

16. The method of claim 14 further comprising connecting the drain of the pulldown transistor to a dummy bit line on a side of the inverter and a gate of an opposite pulldown transistor in the inverter.

17. A method of probing a pullup transistor in a static random access memory (SRAM) circuit, the method comprising:
connecting a gate probe to a gate metal layer of the SRAM circuit, the gate metal layer being coupled to a gate of the pullup transistor;
connecting a source probe to a source metal layer of the SRAM circuit, the source metal layer being coupled to a source of the pullup transistor;
connecting a drain probe to a drain metal layer of the SRAM circuit, the drain metal layer being coupled to a drain of the pullup transistor via a buried contact, the SRAM circuit comprising other transistors along with the pullup transistor;
wherein the other transistors are free from connections for the probing so as not to cause the other transistors to have an unwanted effect on the pullup transistor being probed.

18. The method of claim 17, wherein:
the gate probe, the source probe, and the drain probe are operatively connected to the pullup transistor for measuring the pullup transistor;
the other transistors are not operatively connected for measurements; and
other SRAM circuits are in a same device with the SRAM circuit, the other SRAM circuits being dummy cells, the dummy cells being inactive, the SRAM circuit being active.

19. The method of claim 18 further comprising:
disconnecting the gate of the pullup transistor from a pass gate transistor and an inverter, the pass gate transistor and the inverter being part of the other transistors in the SRAM circuit, another pass gate transistor in the SRAM circuit having a source terminal connected to a bit line; and
connecting the gate of the pullup transistor to the bit line.

20. The method of claim 19 further comprising connecting the drain of the pullup transistor to a dummy bit line on a side of the inverter and a gate of an opposite pullup transistor in the inverter.

* * * * *